United States Patent [19]

Waldo et al.

[11] Patent Number: 4,768,883

[45] Date of Patent: Sep. 6, 1988

[54] ALIGNMENT RETICLE FOR A SEMICONDUCTOR WAFER STEPPER SYSTEM AND METHOD OF USE

[75] Inventors: Whitson G. Waldo; Lawrence M. Genduso, both of Chandler, Ariz.

[73] Assignee: Motorola Inc., Schaumburg, Ill.

[21] Appl. No.: 928,067

[22] Filed: Nov. 7, 1986

[51] Int. Cl.⁴ .............................................. G01B 11/00
[52] U.S. Cl. ..................................... 356/399; 356/401
[58] Field of Search ....................... 356/399, 400, 401; 355/53

[56] References Cited

U.S. PATENT DOCUMENTS

| | | | |
|---|---|---|---|
| 4,388,386 | 6/1983 | King et al. | 356/401 X |
| 4,402,610 | 9/1983 | Lacombat | 356/400 |
| 4,592,648 | 6/1986 | Tabarelli et al. | 356/401 X |
| 4,595,295 | 6/1986 | Wilczynski | 356/400 |
| 4,662,754 | 5/1987 | Mayer | 356/401 |

OTHER PUBLICATIONS

Khoury, H. A., and H. R. Rottman, "Alignment System For Projection Mask", IBM Technical Disclosure Bulletin, vol. 13, No. 3, Aug. 1970, p. 768.

Primary Examiner—Eugene R. LaRoche
Assistant Examiner—Nathan W. McCutcheon
Attorney, Agent, or Firm—Joe E. Barbee; Eugene A. Parsons

[57] ABSTRACT

In a semiconductor wafer stepper system, a reticle having an alignment mark positioned adjacent the center thereof and utilized to align each wafer in the stepper system, as well as to adjust the stepper software of the system.

2 Claims, 1 Drawing Sheet

ALIGNMENT RETICLE FOR A SEMICONDUCTOR WAFER STEPPER SYSTEM AND METHOD OF USE

BACKGROUND OF THE INVENTION

As is well known in the art, there are two basic types of semiconductor wafer stepper systems: an on axis stepper system wherein alignment is accomplished directly through the lens of the stepper system and an off axis stepper wherein alignment is performed through a separate microscope alignment apparatus spaced from the lens column of the stepper system. On all reticles, whether utilized in an off axis or on axis stepper system, there is an alignment inspection aid that is designated as the aid to be used to gauge total overlay of the pattern to be aligned with a previously processed layer on a wafer. The alignment at the lower right hand section of the wafer (with the wafer flat upward) at the die cluster that is directly below the right hand microscope objective (the baseline objective) while the wafer is at the align position, is commonly referred to as the baseline (or X, Y) alignment. The second microscope objective views the die cluster used for angular, or theta, alignment.

The baseline error is the distance from the actual position of the right side microscope objective to the nominal location of the right side objective. Corrections made in software allow the stepper to know the baseline distance a wafer must travel after accurate alignment to reach the optical axis of the reduction lens (i.e. the center of the reduction lens) of the off axis stepper system.

Placement of alignment marks and alignment inspection aids are used universally on reticles of stepper aligners. Generally, they are placed in the scribe grids in a manner that does not attempt to minimize the impact of field registration errors on their subsequent image transfer. The contribution of baseline errors due to field registration errors is impacted by both the placement of the alignment mark and the alignment inspection aid.

It is an object of the present invention to provide new and improved reticles for semiconductor wafer stepper systems.

It is a further object of the present invention to provide improved reticles for semiconductor wafer stepper systems wherein alignment marks and alignment inspection aids are positioned to greatly reduce alignment errors.

It is a further object of the present invention to provide a method of determining software corrections to provide correct baseline distances for off axis alignment stepper systems It is a further object of the present invention to provide a method and apparatus for improving registration accuracy in semiconductor wafer processing and to reduce reprocessing due to misalignment.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENTS

Typical reasons for changes to baseline accuracy in semiconductor wafer stepper systems are: thermal variations of the environment surrounding the stepper system; accidental blows to the microscope alignment apparatus; service on the microscope alignment apparatus; and removal and replacement of reticles during various stages of wafer processing. In a production environment, all offsets to perfect alignment at the baseline die are grouped together and termed baseline errors. In addition to the above sources of baseline errors, there are possible contributions from rotation of the platen in the stepper system, lens reduction, lens trapezoid, imperfections in the reticles of the various layers, lens distortion, reticle misalignment on the platen in the X and Y directions, reticle rotation misalignment on the platen, and global wafer alignment errors. These errors are well known to those skilled in the art and will not be elaborated upon wherein. Of course, there could also be error contributions from the production of the reticle itself, such as improper placement of the alignment marks and alignment aids relative to the center of the reticle or relative to each other, or placement errors by the reticle alignment fiducials relative to the center of the reticle. These baseline errors are typically compensated by using software corrections in an attempt to reduce or minimize the baseline die alignment errors.

Several of the contributions to baseline error are unique in their magnitude in individual stepper systems (e.g. lens reduction, lens trapezoid, and lens distortion). This means that two lots of the same layer on a wafer aligning to a previously aligned and etched layer (where the previous layer was aligned on different steppers for each of the two lots) may have different baseline errors, even if the two lots are now being aligned on the same stepper system (which stepper system may be common to the stepper system utilized for the previous layer of one lot or a different stepper system from the ones used to align the previous layer). In a production or research facility, the magnitude of baseline error is typically so large that test wafers must be used to verify accurate alignment before the rest of a lot is committed to alignment. These test wafers may indicate the need for a baseline software correction to shift the overlay in a compensating direction. These test wafers result in stepper system idle time which may severely impact wafer throughput.

Figure 1:
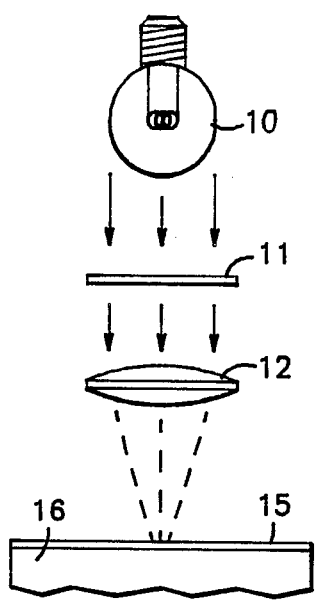
FIG. 1 is a simplified schematic view of the optical column of a semiconductor wafer stepper system.

Referring specifically to FIG. 1, a simplified schematic view of a semiconductor wafer stepper system is illustrated. Basically, the stepper system consists of a light source 10 with a reticle 11 mounted on a platen adjacent thereto for the light to travel through toward a reduction lens system 12. The reduction lens system 12 focuses a reduced image of reticle 11 onto the surface of a wafer 15 fixedly held in position during exposure on a chuck 16. As is well known in the art, chuck 16 is movable in virtually all directions and is stepped through the entire wafer 15 by means of software which automatically operates the stepper system.

Figure 2:
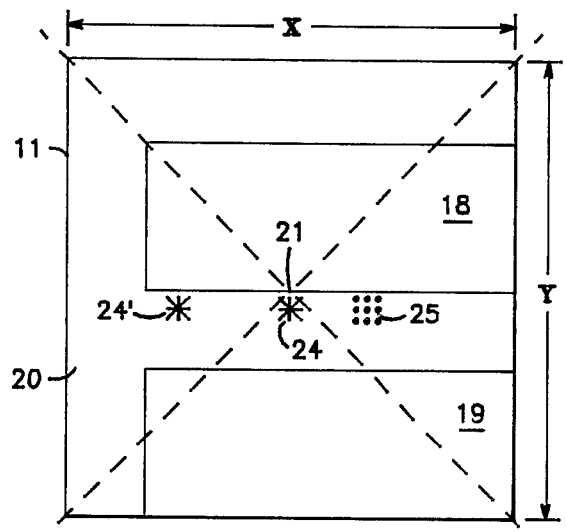
FIG. 2 is a plan view of an improved reticle embodying the present invention.
Figure 3:
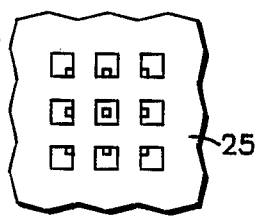
FIG. 3 is an enlarged plan view of a vernier utilized in the reticle of FIG. 2.

FIG. 2 illustrates a reticle 11 having a first pattern 18 and a second pattern 19 formed thereon. Patterns 18 and 19 are separated by scribe grid 20 in the usual manner. It has been determined that generally the center of the reduction lens system 12 (the axis of the lens column) contributes least to field registration errors and the extremities of the image produced by reduction lens system 12 contribute the most to field registration errors. Referring again to FIG. 2, the exact center 21 of reticle 11 is positioned within pattern 18. Therefore, in reticle 11 an alignment mark 24 is positioned within scribe grid 20 as close to center 21 as possible. In fact, alignment mark 24 is exactly centered in the X direction and only a slight distance off in the Y direction. It should be noted that designing reticle 11 so that the horizontal portion of scribe grid 20 contains, or essentially contains, the center point of the reticle is important. Generally, this means that reticle 11 will contain an even number of die (patterns) in the vertical direction. A theta, or angular, alignment mark 24' is also illustrated as positioned in the horizontal portion of scribe grid 20. Since theta alignment mark 24' is used only in angular alignment, in the Y direction, its placement in the X direction is less important. Thus, while mark 24 must be substantially centered in the X and Y direction, mark 24' must be centered in the Y direction. An alignment inspection aid 25 is spaced from alignment mark 24 but positioned as closely to center 21 as possible. Alignment inspection aid 25 may be, for example, a vernier as illustrated in enlarged form in FIG. 3. The vernier of FIG. 3 is designed to detect misalignments in the range of approximately 1/10th micron. The design of reticle 11 so that alignment mark 24 and vernier 25 are in the center of the reticle 11 (corresponding to the center or axis reduction lens system 12), or as close as possible to the center of reticle 11, greatly minimizes the contribution of field registration errors (lens reduction, lens trapezoid, lens distortion) to apparent baseline errors. While the benefit is greatest for off axis alignment stepper systems, the benefit is still substantial for on axis alignment stepper systems.

By optimizing the placement of the alignment marks and alignment inspection aids and thereby reducing or eliminating the effect of field registration errors, it is believed that the magnitude of baseline errors will be reduced so that either test wafers will no longer be needed or it will be possible to safely start aligning wafers of a lot on stepper system without waiting for the return of the test wafer from the lot. In this way, stepper system idle time will be reduced and wafer alignment throughput increased.

Generally, MOS production facilities do not keep a single reticle up on a stepper system for very long periods of time (more than a couple of days). Also, generally, production facilities would prefer to have the flexibility to remove and replace reticles rapidly as the inventory demands. A procedure is described below to determine the baseline error (and therefore the drift) at a reticle change. The test is relatively accurate and consumes a relatively small amount of time.

Figure 4:
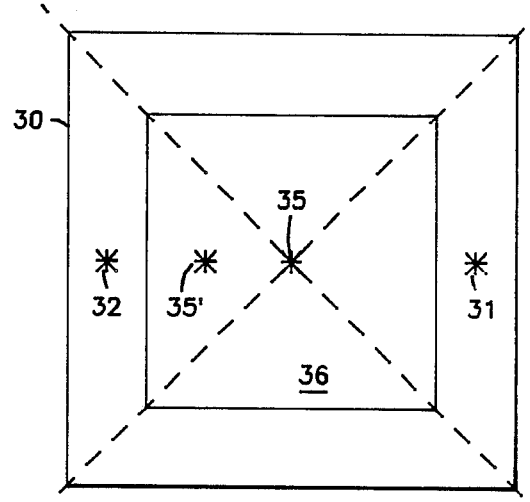
FIG. 4 is a plan view of a special reticle utilized for alignment in an off axis semiconductor wafer stepper system.

At the time that it is desired to change a reticle in a stepper system, a special reticle 30 illustrated in FIG. 4 is aligned on chuck 16. Special reticle 30 includes a pair of alignment fiducials 31 and 32 adjacent opposite edges thereof and an alignment mark 35. Alignment mark 35 is positioned at the exact center of special reticle 30 and may be surrounded, for example, by a chrome field 36. A second alignment mark 35' is illustrated in FIG. 4 and should be centered in the Y direction, as previously discussed with relation to mark 24' (FIG.2 ). Mark 35' is offset in the X direction to allow the proper placement of marks on the wafer, as will be described presently. It will of course be understood by those skilled in the art that alignment marks 24 of FIG. 2 and 35 of FIG. 4 may be formed as opaque marks surrounded by openings through the reticles or may be openings through the reticles surrounded by opaque or chrome field. For simplicity in this disclosure all alignment marks and alignment inspection aids will be referred to as openings through the reticle whether they are in fact clear areas or opaque areas.

Figure 5:
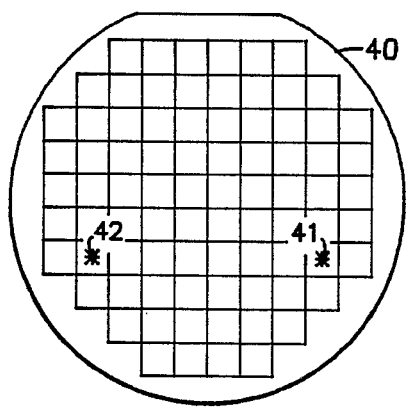
FIG. 5 is a plan view of a wafer exposed in accordance with a new method utilizing the reticle of FIG. 4.
Figure 6:
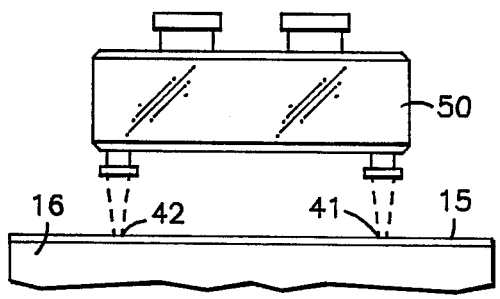
FIG. 6 is a simplified schematic view of microscope alignment apparatus provided in off axis semiconductor wafer stepper systems.

Special reticle 30 is positioned on the platen and aligned with the axis of reduction lens system 12 in the usual manner. A single resist coated wafer 40 is loaded into the input cassette of the semiconductor wafer stepper system to be aligned. In actual practice a special job is specified in the stepper system that will result in the exposure of only two positions on a wafer. By operating the stepper system in the usual fashion wafer 40 will come to the align position beneath reduction lens system 12. With wafer 40 properly positioned with respect to reduction lens system 12, the exact X and Y position of wafer 40 is noted using the laser stage as a metering system. The manual shutter switch is turned on for an exposure time of approximately one second. This exposure results in a first alignment mark 41 (see FIG. 5). The stepper system is then stepped a known distance and a second exposure is accomplished to produce a second alignment mark 42 spaced from alignment mark 41 a known distance in the X direction. The known distance between marks 41 and 42 will generally correspond to the distance between a pair of object lenses in microscope alignment apparatus 50 (see FIG. 6). Generally this distance will not correspond to an integral number of moves of the die size by the stepper system. Therefore, theta alignment mark 35' is used for the second exposure to produce alignment mark 42 at the proper distance from alignment mark 41. Wafer 40 is then moved by means of manual controls away from reduction lens system 12 and, while maintaining vacuum on chuck 16 to maintain wafer 40 properly mounted therein, the exposure is developed in some convenient manner. Developed wafer 40 is then moved manually into an aligned position beneath microscope alignment apparatus 50. Microscope alignment apparatus 50, illustrated in FIG. 6, is typical microscope alignment apparatus utilized in off axis stepper systems. The position of wafer 40 aligned beneath microscope alignment apparatus 50 is noted and the displacement in the X and Y direction between the position of wafer 40 beneath reduction lens system 12 and the position of wafer 40 beneath microscope alignment apparatus 50 is determined. The difference in displacement in X and Y while being exposed by reduction lens system 12 and then being aligned by microscope alignment apparatus 50 is the baseline distance of the microscope objective. Developing the resist image of wafer 40 on chuck 16 with the vacuum maintained is necessary to prevent realignment or any type of uncontrolled wafer movement. Self developing photoresist would be ideal for this method. This baseline test could also be accomplished by utilizing vernier 25, or some other vernier, as an alignment verification aid. Reading these verniers will yield the software correction to give the correct baseline distance in both X and Y.

The baseline test just described gives the baseline distance directly. The nominal baseline distance (the baseline distance already in the software) is needed to determine the amount of correction to the software which is required. This nominal baseline distance can either be supplied by the manufacturer or empirically determined. Special reticle 30 allows determination of the stepper system baseline distance directly by an operator. The test is simple to perform and more accurate than currently available test procedures, since only alignment is performed. Also, since systematic alignment errors are grouped in the term baseline error, performance of this new test by the operator that will align the product lot, will bias the baseline software correction to the alignment that the operator systematically considers optimum. Except for the one test wafer 40 needed for this test, which test wafer should not be a product wafer, baseline test wafers should be eliminated as unnecessary. Registration accuracy will improve, wafer reprocessing rates due to alignment will decrease, and stepper system throughput will increase.

While we have shown and described a specific embodiment of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

We claim:

1. A method of determining software corrections to provide correct baseline distances for off axis alignment stepper systems including microscope alignment apparatus and software for stepping functions, comprising the steps of:

providing a reticle with a center and an alignment mark located at the center of said reticle;

placing said reticle in the alignment stepper system to be corrected;

placing a resist coated wafer in the alignment stepper system;

bringing the resist coated wafer to an aligned position with the reticle and noting the position in the alignment stepper system;

exposing the resist coated wafer through the reticle twice at spaced apart positions corresponding to the microscope alignment apparatus;

developing the resist coated wafer while maintaining the wafer mounted in the alignment stepper system;

aligning the developed alignment marks in the microscope alignment apparatus and noting the position in the alignment stepper system; and adjusting the software in accordance with the difference between the two noted positions.

2. A method of manufacturing semiconductor dies using off axis alignment stepper systems including microscope alignment apparatus and software for stepping functions, comprising the steps of:

providing a reticle with a center and an alignment mark located at the center of said reticle;

placing said reticle in the alignment stepper system to be used in the manufacture of semiconductor dies;

placing a resist coated wafer in the alignment stepper system;

exposing the resist coated wafer through the reticle twice at spaced apart positions corresponding to the microscope alignment apparatus;

developing the resist coated wafer while maintaining the wafer mounted in the alignment stepper system;

aligning the developed alignment marks in the microscope alignment apparatus and noting the position in the alignment stepper system;

adjusting the software in accordance with the difference between the two noted positions; and using the alignment stepper system to manufacture semiconductor dies.

* * * * *